United States Patent

Hamparian et al.

[19]

[11] Patent Number: 5,990,761
[45] Date of Patent: Nov. 23, 1999

[54] PHASE SHIFTER CIRCUIT WITH HIGH LINEARITY

[75] Inventors: Simon Hamparian, Palisades Park; Michael Gordon Kossor, Kenilworth, both of N.J.; Adam Joseph O'Donnell, Philadelphia, Pa.

[73] Assignee: Lucent Technologies Inc., Murray Hill, N.J.

[21] Appl. No.: 09/044,407

[22] Filed: Mar. 19, 1998

[51] Int. Cl.⁶ ..................................................... H03H 7/20
[52] U.S. Cl. ........................... 333/164; 327/237; 327/586
[58] Field of Search .................................... 333/139, 164; 327/234, 237, 586

[56] References Cited

U.S. PATENT DOCUMENTS

| 4,405,907 | 9/1983 | Breese et al. | 333/164 X |
| 4,621,205 | 11/1986 | Miller | 327/586 |
| 4,638,269 | 1/1987 | Dawson et al. | 333/164 |

*Primary Examiner*—Justin P. Bettendorf

[57] ABSTRACT

A phase shifter circuit shifts the phase of a voltage varying RF signal at high RF power levels by using a diode arrangement of back to back diode sets connected in series to reduce the change in capacitive reactance of the diode arrangement. The diode arrangement is connected to a phase adjustment port of a phase shifting device which shifts the phase of the RF signal according to the capacitive reactance level at the phase adjustment port. A control circuit for each back to back diode set can be used to provide independent adjustment of each diode set to balance capacitive reactance responses between the diode sets to further reduce the change in capacitive reactance. In certain embodiments, the phase shifter circuit uses a ninely (90) degree hybrid coupler with two phase adjustment ports, a zero (0) degree port and a –90 degree port. A first diode arrangement of back to back diode sets is connected to the zero degree port, and a second diode arrangement of back to back diode sets is connected to the –90 degree port. Each diode arrangement includes at least a first set of back to back diodes (common cathode) connected in series which a second set of back to back diodes. Using the diode arrangements with multiple back to back diode sets reduces the change in the capacitive reactance of the diode arrangement at high RF signal power levels with wide voltage swings. Additionally, providing each back to back diode set with corresponding control circuitry allows independent adjustment of the capacitive reactance associated with each diode set, providing improved balancing of the capacitive reactance responses between and within the diode arrangements.

18 Claims, 5 Drawing Sheets

PHASE SHIFTER CIRCUIT WITH HIGH LINEARITY

BACKGROUND OF THE INVENTION

1. Field of the Invention

This invention relates to phase shifters and, more particularly, to a phase shifter circuit which provides phase shifting of signals with high linearity at high power levels.

2. Description of Related Art

Altering the phase of a Radio Frequency (RF) signal is often necessary in the processing of RF signals within receivers and transmitters. Many methods have been developed to achieve phase shift of RF signals. Mechanical methods exist which rely on varying the physical length of transmission line to change the electrical length to provide phase shift of the output signal with respect to the input signal. Electrically variable methods exist which rely on controlled reflection of RF signals to alter the phase shift between input and output. One common implementation allows the user to adjust the phase of an RF signal electrically by varying a control voltage. Such circuits have a limitation on the maximum RF signal power level. Operating these circuits beyond a specific RF power level will cause significant non-linear distortion of other RF output signal properties.

FIG. 1 shows a phase shifter circuit 10 based on the use of a 90 degree hybrid coupler 12. A variable capacitive reactance is placed on the 0 degree port 14 by varactor diode CR1 and on the -90 degree port 16 by varactor diode CF2. An input signal applied to the input port 18 is reflected from the 0 degree and -90 degree ports 14 and 16 and appears at an isolated port 20 as the resulting output signal. The phase relationship between input and output signals depends upon the value of the capacitive reactance present on the 0 degree port 14 and -90 degree port 16. The capacitive reactance of a circuit is the impedance of the circuit due to the presence of capacitance. The capacitive reactance $X_c$ of a circuit can be given by $1/\omega C$ where $\omega$ is the frequency of a signal through the circuit and C is the capacitance. The amount of signal loss experienced between input and output is dependent upon how well the capacitance reactance on the 0 degree port 14 is matched to the -90 degree port 16. As such, the reactances are made equal in value to one another. The value of the capacitive reactance is changed by varying the reverse DC bias voltage on diodes CR1 and CR2. As such, the range of phase shift between input and output signals is dependent upon the range of capacitive reactance achieved by changing the DC control voltage $V_{cntl}$.

At low RF power levels, the output signal is nearly identical to the input signal in all respects except phase shift. The amplitude of the output signal is slightly lower due to a small but finite loss through the hybrid coupler 12. As the power level of the RF signal increases, the voltage swing of the RF signal begins to effect the DC bias conditions on the diodes CR1 and CR2. The bias voltage on CR1 becomes different than the bias voltage on CR2, resulting in an imbalance between the capacitive reactances on the 0 degree port 14 and the -90 degree port 16. The imbalance of capacitive reactances between the two ports 14 and 16 causes an amplitude distortion or loss of the output signal at the output (isolated) port 20. The effects of this non-linear distortion at higher RF signal voltage levels can be measured with a two tone Inter-Modulation Distortion (IMD) test. Two RF signals having equal amplitudes at different frequencies (f1 and f2) are applied to the input port 18 and monitored with a spectrum analyzer (not shown) at the output (isolated) port 20. At low RF signal power levels, only the two input signals are present at the output port 20 and are shifted in phase with respect to the two input signals at the input port 18. As the power levels of the two input signals are increased, non-linear distortion occurs as described above and causes mixing of the two RF signals. Newsignals appear at the output port at frequencies of (2×f2)–f1 and (2×f1)–f2. These distortion components are commonly referred to as third-order intermodulation distortion (IMD) products because they are produced by the non-linear multiplication of the two original RF signals. This is an undesirable effect because the IMD products appear as new RF signals which use up frequency spectrum and contain invalid information (a mixture of f1 and f2).

FIG. 2 shows an embodiment of a phase shifter 22 which uses tvo pairs 24 and 26 of varactor diodes connected back to back (common cathode) to provide capacitive reactance on the 0 degree port 14 and the -90 degree port 16, respectively. Using two pairs 24 and 26 of back to back diodes extends the RF signal power level range in which the phase shifter remains linear. FIG. 3a shows a back to back diode arrangement 28 to explain how the diode pairs 24 and 26 are used in the phase shifter 22. RF input signal voltage levels $-V_s$ large enough to cause changes in the DC bias voltage across the diodes D1 and D2 are divided equally across diodes D1 and D2, thereby providing less of a change in the DC bias voltage across the diodes D1 and D2. The positive voltage impressed across D1 functions to decrease the capacitive reactance of D1, and the positive voltage impressed across D2 functions to increase the capacitive reactance of D2. As such, the effect on D1 cancels the eifect on diode D2. Thus, the single back to back diode configuration maintains more stable capacitive reactance values at higher RF input signal voltage levels $V_s$. FIG. 3b illustrates how the capacitive reactance of diode D1 cancels the effects of diode D2 when the RF signal reverses polarity for the single back to back diode configuration 28. As in FIG. 3a, RF signal voltage levels $-V_s$ large enough to cause changes in the DC bias voltage across the diodes D1 and D2 are divided equally across diodes D1 and D2. The negative voltage impressed across D1 functions to increase the capacitive reactance of D1. The negative voltage impressed across D2 functions to decrease the capacitive reactance of D2. Again, the effect on the change in capacitive reactance on D1 cancels the effect on the change of capacitive reactance on the diode D2.

The phase shifter 22 of FIG. 2 uses matched diodes D1 and D2 for the diode pair 24 and matched diodes D3 and D4 for the diode pair 26. Matched diodes are used in an attempt to prevent imbalances in the capacitive reactance responses between the diodes D1 and D2 for the diode pair 24 and between the diodes D3 and D4 of diode pair 26, but does not prevent imbalances between the pairs 24 and 26. Using matched diodes can also help to reduce parasitic inductances which can effect the capacitive reactances of the diode pairs 24 and 26. An imbalance in the capacitive reactance between the 0 and -90 degree ports 14 and 16 should be avoided to prevent an increase in the insertion loss between the input and the output ports 18 and 20. Differences in the capacitive reactance responses between the diodes D1 and D2 and between the diodes D3 and D4 can create distortion and cause imbalances in the capacitive reactance between the 0 degree port 14 and the -90 degree port 16 of the coupler 12. Diodes available in the same package made from the same wafer generally guarantee similar characteristics. Using the standard two tone IMD test, an improvement of more than 18 decibels (dB) in the difference between the output signal power level and the IMD power level was found between the phase shifter 22 (FIG. 2) and the phase shifter 10 (FIG. 1) for the same input power levels.

Today, high power linear amplifiers operating in the cellular and PCS frequency bands (869–894 MHz and 1930–1990 MHz) produce signals having power levels much greater than typically encountered in the past. These high power level signals test the limits of current phase shifter designs. At these high power levels and even using matched diodes, imbalances in the capacitive reactance between the control ports 14 and 16 can result in insertion losses between the input and output ports 18 and 20. Wide voltage swings in the RF signal can cause such capacitive reactance mismatches due to different capacitive reactance responses between the diode pairs 24 and 26. The differences in the capacitive responses may reflect capacitive reactance response differences between the diodes D1 and D2 and/or between diodes D3 and D4 within a diode pair 24 or 26. Thus, a need exists for a voltage-variable phase shifter circuit with an extended linear power level range which is capable of changing only the phase of RF signals at high power levels.

SUMMARY OF THE INVENTION

The present invention involves a phase shifter circuit which shifts the phase of a voltage varying RF signal at high RF power levels by using a diode arrangement of back to back diode sets connected in series to reduce the change in capacitive reactance of the diode arrangement. The diode arrangement is connected to a phase adjustment port of a phase shifting device which shifts the phase of the RF signal according to the capacitive reactance level at the phase adjustment port. A control circuit for each back to back diode set can be used to provide independent adjustment of the capacitive reactance for each diode set to further reduce the change in total capacitive reactance. In certain embodiments, the phase shifter circuit uses a ninety (90) degree hybrid coupler with two phase adjustment ports, a zero (0) degree port and a −90 degree port. A first diode arrangement of back to back diode sets is connected to the zero degree port, and a second diode arrangement of back to back diode sets is connected to the −90 degree port. Each diode arrangement includes at least a first set of back to back diodes (common cathode) connected in series which a second set of back to back diodes. Using the diode arrangements with multiple back to back diode sets reduces the change in the capacitive reactance of the diode arrangement at high RF signal power levels with wide voltage swings. Additionally, providing each back to back diode set with corresponding control circuitry allows independent adjustment of the capacitive reactance associated with each diode set, providing improved balancing of the capacitive reactance between and within the diode arrangements.

BRIEF DESCRIPTION OF THE DRAWINGS

Other aspects and advantages of the present invention may become apparent upon reading the following detailed description and upon reference to the drawings in which.

DETAILED DESCRIPTION

Figure 4:
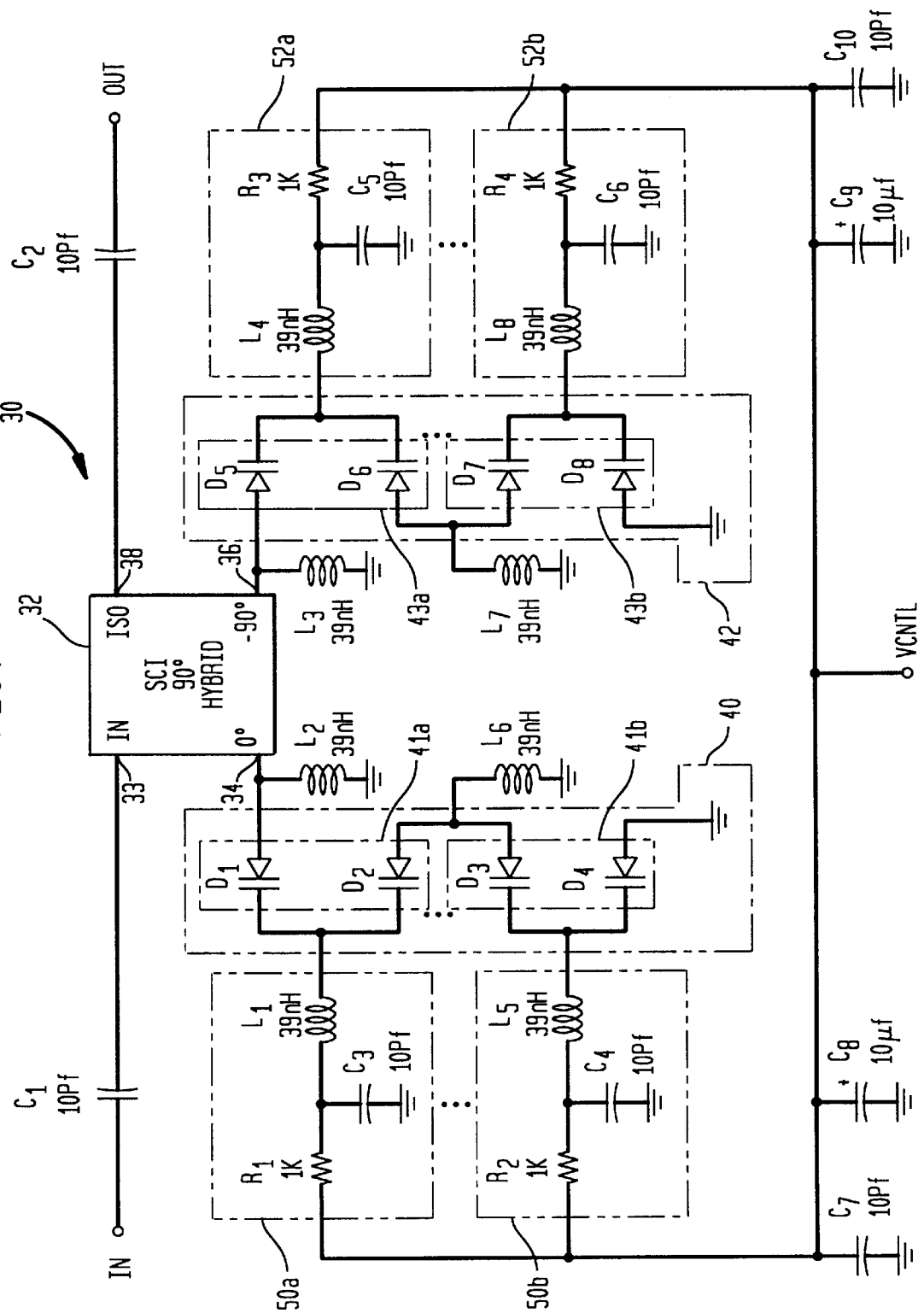
FIG. 4 shows a general schematic of an embodiment of the phase shifter according to the principles of the present invention which uses diode arrangements of multiple back to back diode sets.

Illustrative embodiments of the phase shifter circuit with an extended linear power range level for high RF input signal power levels according to the principles of the present invention is described below. With particular reference to FIG. 4, a phase shifter circuit 30 uses a 90 degree hybrid coupler 32 having an input port 33 which receives a signal to be phase shifted. Depending on the levels of capacitive reactance at a zero (0) degree port 34 and at a −90 degree port 36 (phase adjustment ports) of the coupler 32, an output signal is produced at the output port 38 with a particular phase shift when compared to the input signal. The level of capacitive reactance at the 0 degree port 34 and the −90 degree port 36 can be varied by changing the control voltage $V_{cntl}$. Ideally, for a linear phase shifter, once the control voltage $V_{cntl}$ is set, the only difference between the input signal and the output signal is the phase shift corresponding to the capacitive reactance set by the DC bias control voltage $V_{cntl}$. At high power levels, however, such as those encountered in the cellular and PCS frequency bands (869–894 MHz and 1930–1990 MHz), imbalances in the capacitive reactance between the 0 degree port 34 and the −90 degree port 36 can result in losses between the input and output ports 33 and 38 and cause non-linear distortion of the signals that pass through the phase shifter 30.

The phase shifter 30 uses diode arrangements 40 and 42 to place a variable capacitive reactance on the 0 degree port 34 and the −90 degree port 36 of the hybrid coupler 32, respectively, to produce a phase shifter. The first diode arrangement 40 is connected to the 0 degree port 34 of the hybrid coupler 32 and includes a set 41a of back to back (common cathode) diodes connected in series to a set 41b of back to back diodes. The second diode arrangement 42 is connected to the −90 degree port 36 of the hybrid coupler 32 and includes a set 43a of back to back diodes connected in series to a set 43b of back to back diodes. In this particular embodiment, each diode arrangement 40 (or 42) comprises two sets 41 a–b (or 43a–b) of back to back diode pairs connected in series. Embodiments are possible using additional and/or different back to back diode configurations or arrangements.

Each set of diode pairs 41a–b (or 43a–b) comprises back to back diodes D1 and D2 (D5 and D6) in series with the back to back diodes D3 and D4 (D7 and D8). For the frequency range 1930–1990 MHz, each diode capacitance is selected to vary between 4 and 20 pf as the control voltage $V_{cntl}$ changes from 30 V–0 V. Each set of diode pairs 41 a–b (or 43a–b) is configured to reduce the total change in the capacitive reactance over the diode arrangement 40 (or 42) caused by signal voltage swings. RF signal voltage levels $V_s$ large enough to cause changes in the DC bias voltage across the diodes D1–D4 (D5–D8) are divided across the diodes D1–D4 (D5–D8). By having two diode pairs 41 a–b (or 43a–b), the voltage of the applied RF input signal is spread among diodes D1, D2, D3 and D4 (or D5, D6, D7 and D8).

In this particular embodiment, the individual RF signal voltage seen by any one diode in the set is ideally only one quarter of the total applied RF signal voltage. As such, the change in the DC bias voltage across the individual diodes caused by voltage swings is reduced, and thereby the change in capacitive reactance of each diode is reduced. By using the structure of the diode arrangements 40 and 42 as described below, the change in capacitive reactance of and between the diode arrangements 40 and 42 is reduced for changing voltage levels. Reducing the change in capacitive reactance reduces the non-linear distortion of the RF signal caused by changes in the level of capacitive reactance at the 0 degree port 34 and the −90 degree port 36 and by imbalances between the capacitive reactances at the 0 degree port 34 and the −90 degree port 36. The RF signal power applied to the new phase shifter circuit 30 can be increased significantly higher (>10 dB) than existing phase shifter circuits while providing the same level of non-linear distortion of the RF signal.

Figure 5:
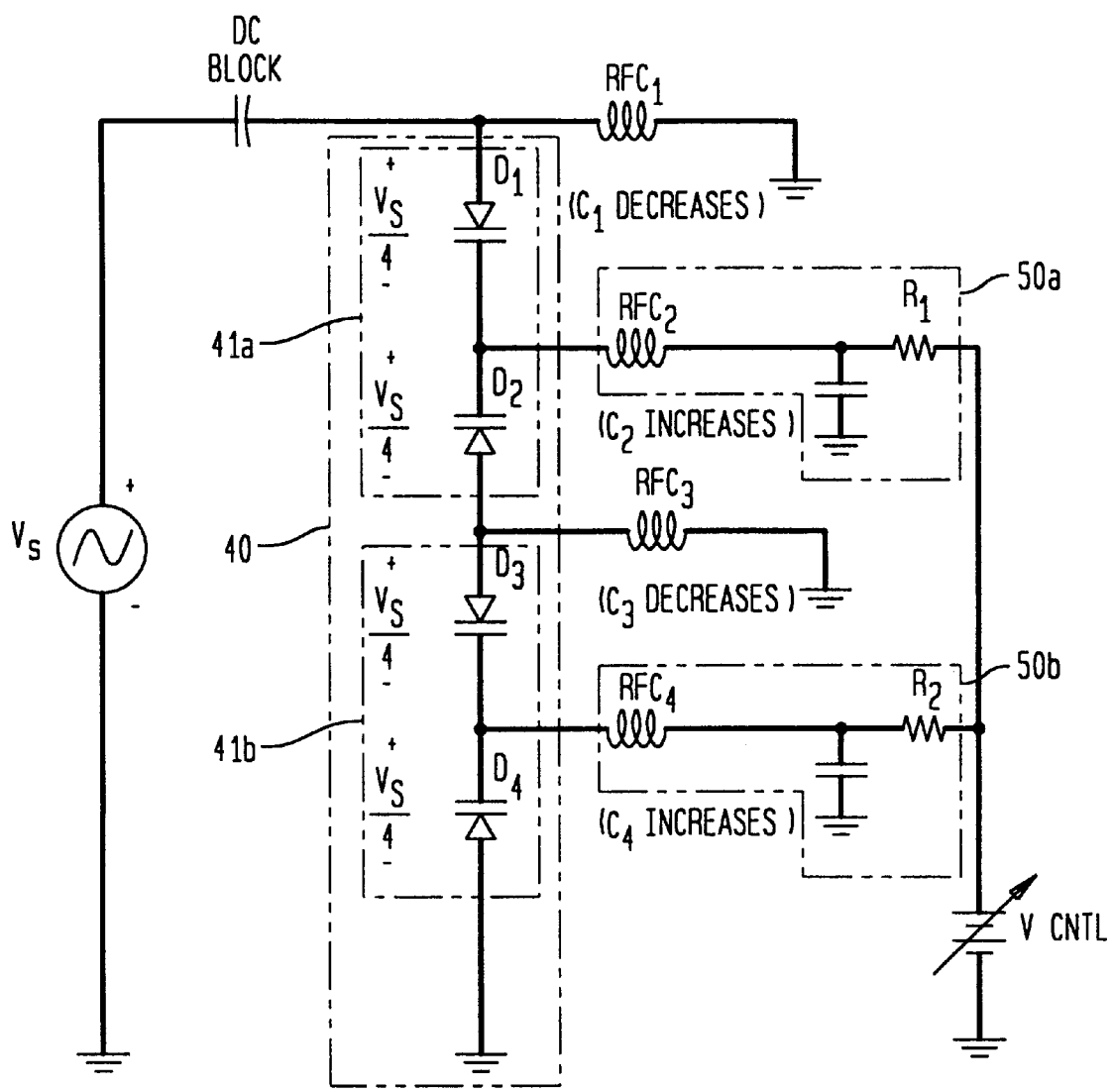
FIGS. 5 shows a circuit diagram for explaining how the phase shifter circuit of FIG. 4 responds to a voltage varying RF signal.

FIG. 5 shows how the back to back diode arrangements 40 of diodes D1–D4 minimizes the change in capacitive reactance caused by large RF signal power levels having large voltage swings. FIG. 5 illustrates the how an RF signal voltage swing $V_s$ is reduced across the individual varactor diodes D1–D4 (4 to 20 pf of capacitance) to a quarter of $V_s$. As such, the DC bias point of the individual diodes D1–D4 is less effected by the high RF signal power levels, thereby the change in capacitive reactance across the individual diodes is reduced as is the total change in capacitive reactance of the diode arrangement 40 (or 42). A positive voltage impressed across D1 and D3 tends to decrease the capacitive reactance of D1 and D3 respectively. The positive voltage impressed across D2 and D4, however, tends to increase the capacitive reactance of D2 and D4 respectively, thereby reducing the effects of D1 and D3 respectively. Thus, the diode arrangements 40 (or 42) reduce the change in capacitive reactance by using back to back diode sets 41 a–b (or 43a–b) connected in series.

Maintaining the balance of capacitive reactance on the 0 and −90 degree ports 34 and 36 at different frequencies assists in reducing signal loss through the phase shifter 30, providing phase flatness of the signal (rate of change of phase with frequency), providing gain flatness (rate of change of gain with frequency) and matching the input and output impedances (for example, Zin=Zout=50 ohms). Parasitic reactances, both capacitive and inductive, can disrupt the balance of capacitive reactance on the 0 degree port 34 and the −90 degree port 36. The parasitic effects may not be constant with frequency. Many phase shifter applications require the amplitude response to remain constant with frequency, excellent phase flatness and good input/output return loss (a measure of how the mismatch between input impedance Zin and 50 ohms). At high power levels with varying voltage levels where parasitic reactances can disrupt the balance in capacitive reactance, the phase shifter 30 can compensate for these parasitic effects and provide an improved capacitive reactance balance on the 0 degree port 34 and the −90 degree port 36.

Improvement in phase shifter performance can be realized by fabricating diodes D1, D2, D3 and D4 on the same semi-conductor chip. All diodes achieve similar operating characteristics when fabricated on the same chip. Capacitor ratios between D1 and D2 will be very similar to capacitor ratios between D3 and D4. Furthermore, the capacitor ratios between D1 and D2 will track very closely to the capacitor ratios of D3 and D4 over temperature. Another benefit of fabricating and packaging all diodes from a single semi-conductor wafer is the minimization of parasitic inductances associated with interconnecting the diodes to the phase shifter circuit.

FIGS. 4 and 5 show each back to back diode set 41a–b and 43a–b having a corresponding control circuit 50a–b and 52a–b. Capacitive reactance mismatches at the 0 degree port 34 and the −90 degree port 36 can result from differences in the capacitive reactance responses between the first and second diode arrangements 40 and 42 which may be due to capacitive reactance response differences between the individual diode sets 41a and 41b or 43a and 43b. The capacitive reactance response differences can be due to differences in parasitic inductances between diode arrangements 40 and 42 and between individual sets 41a–b and 43a–b. Individual control circuits 50a–b and 52a–b provide the ability to individually compensate for differences in capacitive reactances between and/or within diode arrangements 40 and 42 by providing different reverse leakage currents across the diode sets 41 a–b and 43a–b operating from a single control voltage source $V_{cntl}$. For the diode sets 41a–b, resistors R1 and R2 allow the reverse leakage current path of the diode set 41a to be different from the reverse leakage current path of the diode set 41b. As such, the actual reverse voltage impressed across each diode set to be different, thereby enabling the independent adjustment of the capacitance of each diode set. The values of resistors R1 and R2 associated with the 0 degree input 34 (FIG. 4) of the hybrid coupler 32 (FIG. 4) can be independently adjusted to improve phase shifter performance by balancing the capacitive reactance responses of the diode sets 41 a–b of the diode arrangement 40. Similarly, for the diode sets 43a–b, resistors R3 and R4 associated with the −90 degree port 36 of the hybrid coupler 32 can be independently adjusted to improve phase shifter performance by balancing the capacitive reactance responses of the diode sets 43a–b of the diode arrangement 42. Balancing the diode sets 41a–b and 43a–b within the diode arrangements 40 and 42 reduces the change in capacitive reactance of the diode arrangement 40 and 42 from large voltage swings. Additionally, adjusting the individual control circuits can also be used to not only reduce the change in capacitive reactance between the sets 41a–b and 43a–b within the diode arrangements 40 and 42, but also to reduce any imbalance in total capacitive reactance between the diode arrangements 40 and 42.

Figure 1:
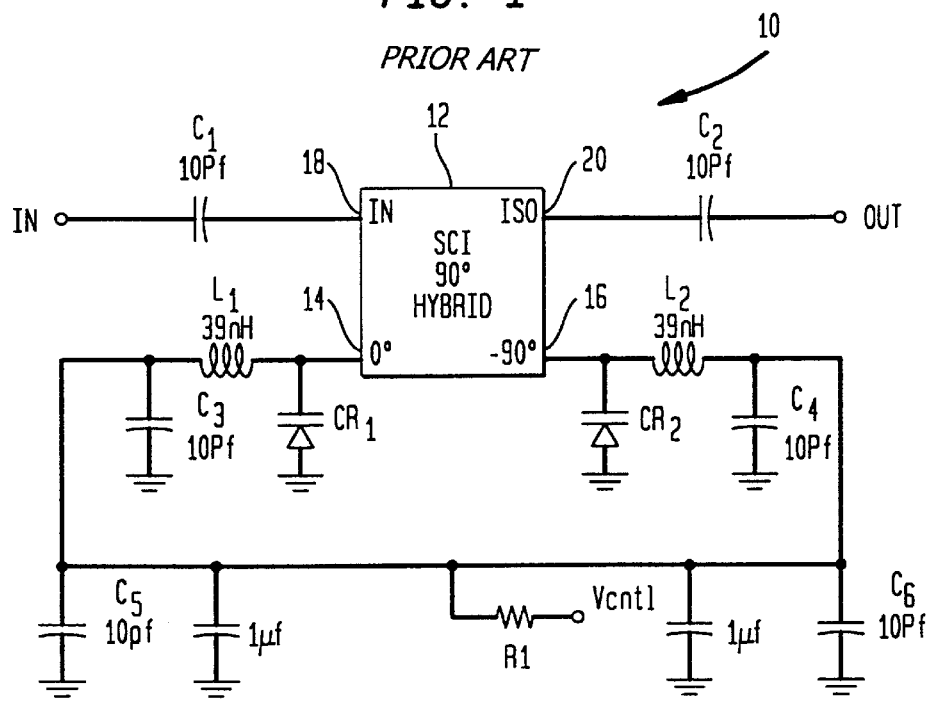
FIG. 1 shows a general schematic for a standard phase shifter known in the prior art.
Figure 2:
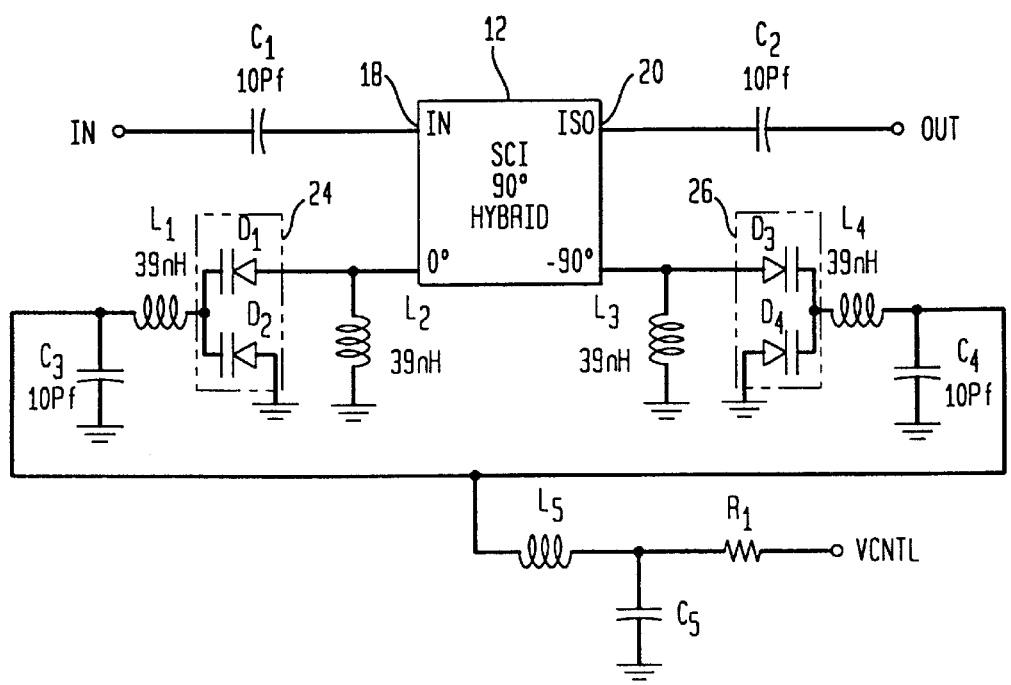
FIG. 2 shows a schematic for a phase shifter using a back to back diode pairs.
Figure 3A:
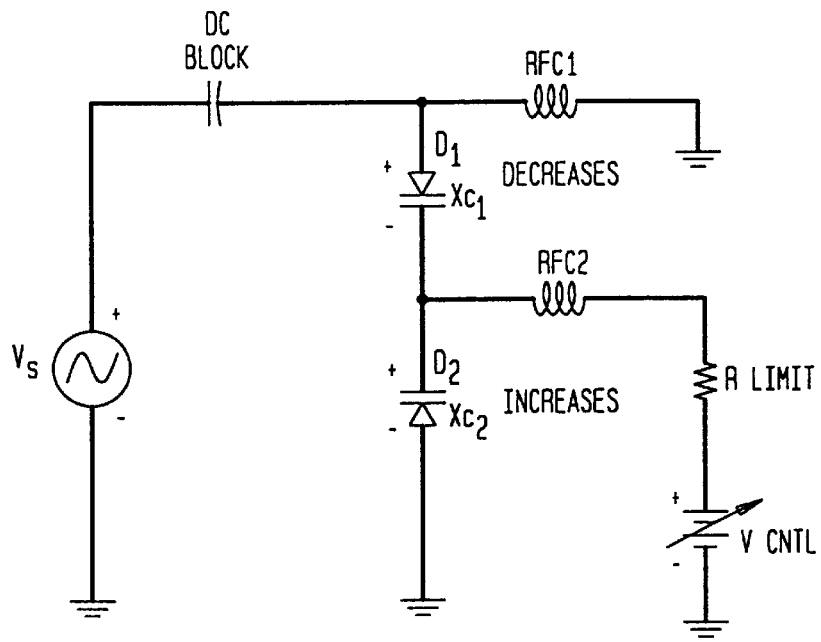
FIGS. 3a and b show circuit diagrams for explaining how the phase shifter circuit of FIG. 2 responds to a voltage varying RF signal.
Figure 3B:
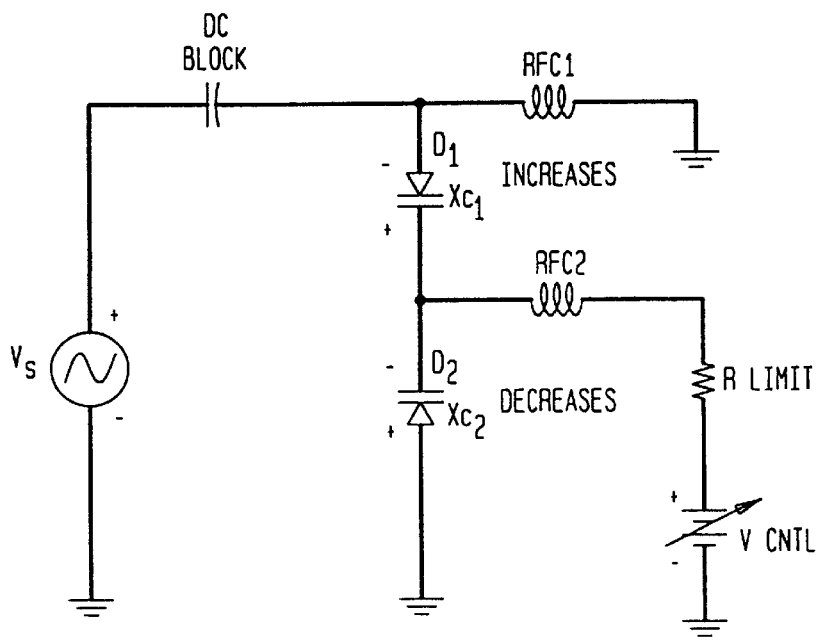

For example, the phase shifter circuit 30 has shown an extended operating range at high power levels with varying voltages. The improvement in linear operation as measured with a standard two tone IMD test is more than 7.5 dBc better than the phase shifter of FIG. 2 with the same input power levels. This improvement in linear operating range is achieved while maintaining an amplitude flatness of less than 0.2 dB, phase flatness of better than 0.45 degree, input return loss of less than−15 dB while delivering more than a 125 degrees of phase shift over the frequency range of 1.93 GHz to 1.99 GHz. Phase is adjustable from X to Y where Y−X=125 degrees. The absolute values of X and Y are not as important as the range of the adjustment.

Figure 6:
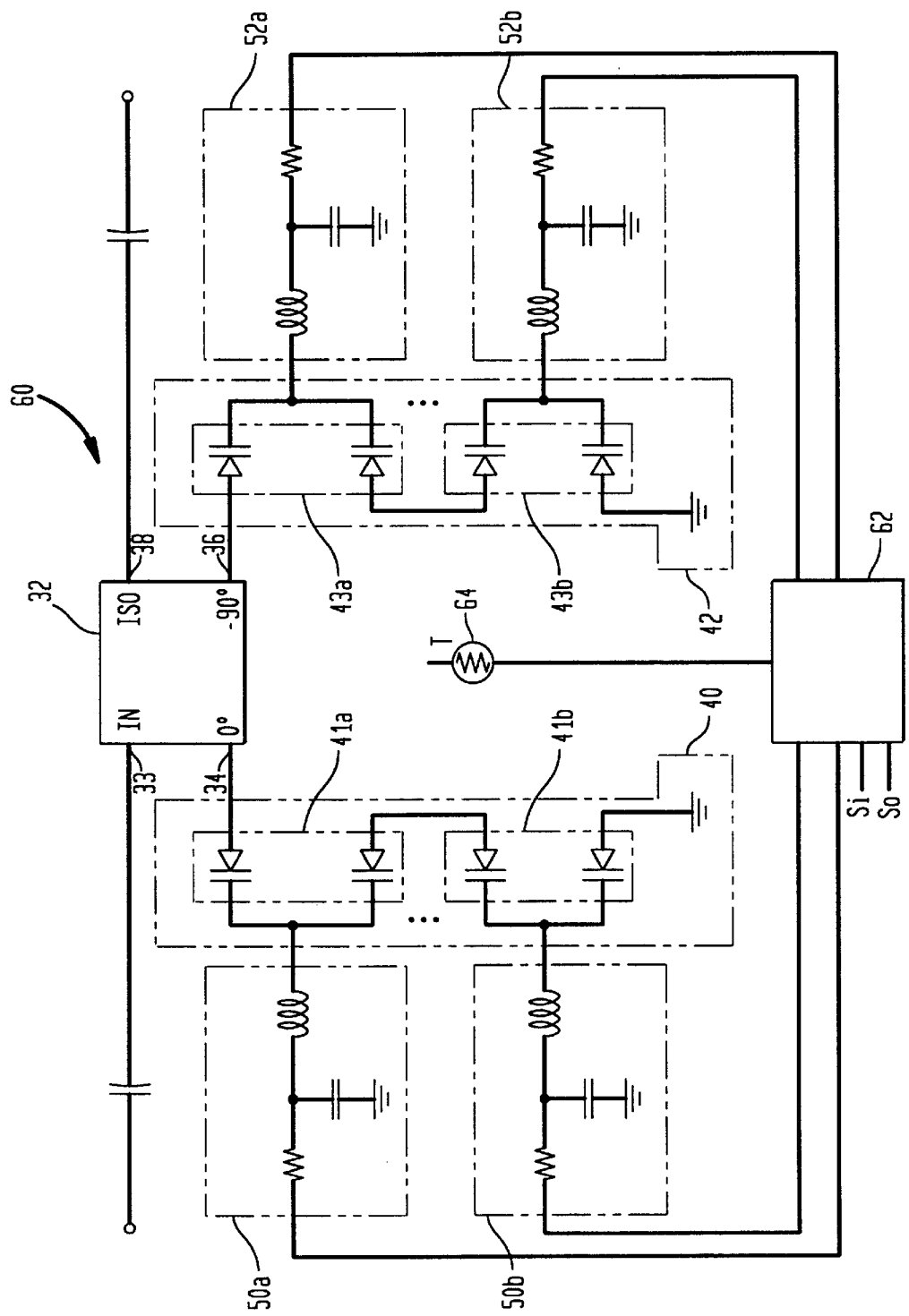
FIG. 6 shows another embodiment of the phase shifter according to the principles of the present invention which uses diode arrangements of multiple back to back diode sets with independent control voltage adjustment of each diode set.

FIG. 6 shows another embodiment of a phase shifter circuit 60 according to the principles of the present invention. In this particular embodiment, the phase shifter circuit 60 uses the hybrid coupler 32 having the input port 33 which receives a signal to be phase shifted and the output port 38 which produces the phase shifted signal. The amount of phase shift is determined by the level of capacitive reactance at the 0 degree and −90 degree ports 34 and 36. As mentioned above, if there is an imbalance between the levels of capacitive reactance between the 0 degree and −90 degree ports 34 and 36, losses are introduced between the input signal and the phase shifted output signal. A diode arrangement 40 connected to the 0 degree port 34 and a diode arrangement 42 connected to the −90 degree port 36 can reduce the change in capacitive reactance at the ports 34 and 36 for voltage varying signals. However, with RF signals having high variations in voltage power levels, imbalances in the level of capacitive reactance can occur due to response differences within and between the diode arrangements 40 and 42. These types of response differences can occur due to numerous reasons, such as small manufacturing differences. As in FIG. 4, by using independent control circuitry 50a–b and 52a–b for corresponding diode sets 41a–b and 43a–b controlled by a single control voltage $V_{cntl}$, the variations in response between the diode sets 41a–b and 43a–b can be balanced by adjusting the resistance, inductance and/or capacitance of the different control circuits 50a–b and 52a–b to reduce the change in capacitive reactance and/or loss.

Rather than adjusting the components of the independent control circuits 50a–b and 52a–b and maintaining a single control voltage $V_{cntl}$, the phase shifter 60 uses a controller 62 to provide multiple control input signals, such as voltage signals $V_{c1}$–$V_{c4}$, to the control circuits 50a–b and 52a–b. By providing different control signals to the control circuits 50a–b and 52a–b, the controller 62 can compensate for operating differences between the diode sets 41a–b and 43a–b and/or between the diode arrangements 40 and 42 to control the capacitive reactances between and/or within the diode arrangements 40 and 42. The controller 62 could have a look up table which characterizes the diode sets 41a–b and 43a–b such that the controller provides the control signals $V_{c1}$–$V_{c4}$ which provides the appropriate phase shift with minimum loss. To further improve phase shifter performance, the controller 62 could receive other inputs to determine the control signals which would provide capacitive reactance balance or reduced loss. For example, a temperature sensitive device 64 could provide a temperature input to the controller 62 to determine the appropriate control signals $V_{c1}$–$VC_{c4}$. Other inputs to the controller 62 to determine the control signals $V_{c1}$–$V_{c4}$ to provide to the control circuits 50a–b and 52a–b can include the amplitude (such as of power, voltage or current) of the input signal and/or the shifted signal. In response to these inputs, the controller 62 could adjust the control signals to improve the loss performance of the phase shifter. The controller 62 could do change control signals in response to changing inputs by using a lookup table and/or by performing dynamic calculations to determine appropriate control signals for changing inputs as the inputs change.

In addition to the embodiment described above, alternative configurations of the phase shifter according to the principles of the present invention are possible which omit and/or add components and/or use variations or portions of the described system. For example, the phase shifter is described as using a 90 degree hybrid coupler as the phase shifting device, but different phase shifter arrangements are possible which could use other phase shifting components having different numbers of control ports. The phase shifter circuit of the present invention reduces the change in the capacitive reactance (or other controlling parameter which is related to capacitive reactance) to a control port of the phase shifting device for RF signals having large voltage swings to reduce non-linear distortion of the RF signal. The amount of loss and/or phase shift deviation from the desired phase shift which is tolerated depends on the particular application and the corresponding tolerances permitted by the application. These operating design parameters also can determine which components can be added, changed or omitted. Additionally, the diode arrangements have been described as having two sets of back to back diodes, but N sets of back to back diodes with corresponding control circuits are possible, where N>2. Alternatively, in embodiments using multiple control signals, a first control signal, such as a control voltage $V_{c1}$, could be used to control the capacitive reactance of a first diode arrangement and a second control signal, such as a control voltage $VC_{c2}$, to control the capacitive reactance of a second diode arrangement.

As would be understood by one of ordinary skill in the art, the various components making up the phase shifter system and their respective operating parameters and characteristics, such as loss, should be properly matched up to provide the proper operation. Furthermore, the phase shifter system has been described using a particular configuration of distinct components, but it should be understood that the phase shifter system and portions thereof can be implemented in application specific integrated circuits, software-driven processing circuitry, firmware or other arrangements of discrete components as would be understood by one of ordinary skill in the art with the benefit of this disclosure. Although in the illustrative embodiment is shown with a particular circuitry, the phase shifter system can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

We claim:

1. A phase shifter circuit having a phase shifting device which shifts the phase of an input signal according to a control level at at least a first phase adjustment port of said phase shifting device to provide a phase shifted output signal, said phase shifter circuit comprising:

a first set of N back to back diode arrangements, where N>1, which are connected in series and connected to said at least one phase adjustment port of said phase shifting device; and control circuitry independently controlling a capacitance of each set of N back to back diode arrangements in said first set to variably control said control level such that a phase shift of said phase shifting device is controllable in a continuously variable manner.

2. The phase shifter circuit of claim 1 wherein said phase shifting device has a second phase adjustment port, said phase shifter circuit further comprising:

a second set of N back to back diode arrangements, where N>1, which are connected in series and connected to said second phase adjustment port.

3. The phase shifter of claim 2, wherein said control circuitry independently controls a capacitance of each set of N back to back diode arrangements in said second set.

4. The phase shifter of claim 3 wherein said control circuitry comprises:

N control circuits each of which is connected to one of said N back to back diode arrangements of said second set.

5. The phase shifter of claim 3, wherein said control circuitry independently controls said capacitance of each set of N back to back diode arrangements in said first and second sets such that a capacitive reactance level of said first phase adjustment port is balanced with a capacitive reactance level of said second phase adjustment port.

6. The phase shifter of claim 1 wherein said control circuitry comprises:

N control circuits each of which is connected to one of said N back to back diode arrangements in said first set.

7. The phase shifter of claim 6 wherein said control circuitry comprises:

N control lines each of which is connected to one of said N control circuits.

8. The phase shifter of claim 7 wherein said control circuitry comprises:

a controller connected to said N control lines and providing N control signals on said N control lines to said N control circuits.

9. The phase shifter of claim 1 wherein N is equal to two.

10. The phase shifter of claim 1 wherein said phase shifting device is a ninety degree hybrid coupler.

11. The phase shifter of claim 1 wherein each of said diode arrangements in said first set includes a first diode and a second diode connected at the cathodes for said first and second diodes.

12. The phase shifter of claim 1, wherein each diode in said N back to back diode arrangements of said first set is a varactor diode.

13. A phase shifter circuit having a hybrid coupler which shifts the phase of an input signal according to the capacitive reactance levels at a zero (0) degree port and a −90 degree port of said hybrid coupler to provide a phase shifted output signal, said phase shifter circuit comprising:

a diode arrangement including first and second back to back diode pairs connected in series and connected to said 0 degree port of said hybrid coupler;

a second diode arrangement including third and fourth back to back diode pairs which are connected in series and connected to said −90 degree port of said hybrid coupler; and control circuitry independently controlling a capacitance of said first, second, third and fourth back to back diode pairs to variably control said capacitive reactance levels of said 0 and −90 degree ports such that a phase shift of said phase shifting device is controllable in a continuously variable manner.

14. The phase shifter of claim 13, wherein said control circuitry comprises:

a first control circuit connected to said first diode pair;

a second control circuit connected to said second diode pair;

a third control circuit connected to said third diode pair; and a fourth control circuit connected to said fourth diode pair.

15. The phase shifter of claim 14 wherein said control circuitry further comprises:

a first control line connected to said first control circuit;

a second control line connected to said second control circuit;

a third control line connected to said third control circuit; and a fourth control line connected to said fourth control circuit.

16. The phase shifter of claim 15 wherein said control circuitry further comprises:

a controller connected to said first, second, third and fourth control lines and providing control signals on said first, second, third and fourth control lines to said first, second, third and fourth circuits respectively.

17. The phase shifter of claim 13, wherein said control circuitry independently controls a capacitance of said first, second, third and fourth back to back diode pairs such that said capacitive reactance level of said 0 degree port is balanced with said capacitive reactance level of said −90 degree port.

18. The phase shifter of claim 13, wherein each diode in said first, second, third and fourth diode pairs is a varactor diode.

* * * * *